United States Patent
Engewald et al.

(10) Patent No.: US 11,653,450 B2
(45) Date of Patent: May 16, 2023

(54) POWER DISTRIBUTOR OF AN ELECTRICAL SYSTEM OF A MOTOR VEHICLE

(71) Applicant: Ellenberger & Poensgen GmbH, Altdorf (DE)

(72) Inventors: Manuel Engewald, Nuremberg (DE); Sascha Hoenig, Hersbruck (DE); Dietmar Koops, Nuremberg (DE); Ewald Schneider, Offenhausen (DE); Wolfgang Ullermann, Schwabach (DE)

(73) Assignee: Ellenberger & Poensgen GmbH, Altdorf (DE)

( * ) Notice: Subject to any disclaimer, the term of this patent is extended or adjusted under 35 U.S.C. 154(b) by 85 days.

(21) Appl. No.: 17/207,399

(22) Filed: Mar. 19, 2021

(65) Prior Publication Data
US 2021/0291766 A1    Sep. 23, 2021

(30) Foreign Application Priority Data
Mar. 19, 2020    (DE) ...................... 10 2020 203 560.1

(51) Int. Cl.
| | |
|---|---|
| *H05K 1/18* | (2006.01) |
| *H02J 13/00* | (2006.01) |
| *B60R 16/03* | (2006.01) |
| *H02J 9/04* | (2006.01) |

(52) U.S. Cl.
CPC .............. *H05K 1/18* (2013.01); *B60R 16/03* (2013.01); *H02J 9/04* (2013.01); *H02J 13/0004* (2020.01)

(58) Field of Classification Search
None
See application file for complete search history.

(56) References Cited

U.S. PATENT DOCUMENTS

| | | | |
|---|---|---|---|
| 7,167,377 B2 | 1/2007 | Onizuka et al. | |
| 9,949,363 B2* | 4/2018 | Nakamura | H05K 1/181 |
| 10,154,590 B2* | 12/2018 | Chin | H05K 1/111 |
| 2004/0100786 A1* | 5/2004 | Hong | H01H 85/201 |
| | | | 361/837 |
| 2004/0223304 A1* | 11/2004 | Kobayashi | B60R 16/0238 |
| | | | 361/715 |
| 2007/0263344 A1* | 11/2007 | Kriegesmann | H01H 85/044 |
| | | | 307/35 |

(Continued)

FOREIGN PATENT DOCUMENTS

| | | | | |
|---|---|---|---|---|
| CA | 2854731 A1 * | 5/2013 | ........... | H01R 25/162 |
| CN | 203632026 U * | 6/2014 | ......... | B60R 16/0238 |

(Continued)

OTHER PUBLICATIONS

Foreign and Translation of JP2008-206377 (Year: 2008).*

*Primary Examiner* — Timothy J. Dole
*Assistant Examiner* — Muhammed Azam
(74) *Attorney, Agent, or Firm* — Muncy, Geissler, Olds & Lowe, P.C.

(57) ABSTRACT

A power distributor of an electrical system of a motor vehicle, including a circuit board, which has a main connection to a main circuit and multiple secondary connections. Each secondary connection is assigned to one secondary circuit and electrically contacted with the main connection via a respective circuit breaker that has two connections. The two connections of each circuit breaker are electrically contacted directly with the circuit board.

12 Claims, 6 Drawing Sheets

(56) References Cited

U.S. PATENT DOCUMENTS

| | | |
|---|---|---|
| 2009/0142940 A1 | 6/2009 | Ikeda |
| 2018/0034504 A1 * | 2/2018 | Kirk .................... G07C 5/0808 |
| 2019/0214749 A1 | 7/2019 | Chang et al. |
| 2021/0291766 A1 * | 9/2021 | Engewald ............... B60R 16/03 |

FOREIGN PATENT DOCUMENTS

| | | | |
|---|---|---|---|
| CN | 107797019 A * | 3/2018 | |
| DE | 3417422 C2 * | 4/1991 | |
| DE | 202004008141 U1 * | 11/2005 | ............. H02B 1/056 |
| DE | 102007058695 A1 * | 9/2008 | ........... H01H 1/5805 |
| DE | 10254910 B4 | 12/2008 | |
| DE | 102007032709 A1 * | 1/2009 | ............. H02B 1/205 |
| DE | 102008058904 A1 | 7/2009 | |
| DE | 102009032970 A1 * | 3/2010 | ......... B60R 16/0238 |
| DE | 102009032971 A1 * | 3/2010 | ......... B60R 16/0238 |
| DE | 102009004960 A1 * | 7/2010 | ............. B60R 16/03 |
| DE | 202015104681 U1 * | 10/2015 | ............... H02G 3/16 |
| DE | 102009023607 B4 * | 12/2016 | ......... B60R 16/0238 |
| DE | 102015221899 B3 * | 12/2016 | .............. E04F 21/18 |
| DE | 102015115624 A1 * | 3/2017 | ......... B60R 16/0238 |
| DE | 112015005727 T5 * | 8/2017 | ............. B60R 16/03 |
| EP | 1168550 A2 * | 1/2002 | ........... H01H 71/082 |
| EP | 1176683 A2 * | 1/2002 | ......... B60R 16/0238 |
| EP | 1203698 A2 * | 5/2002 | ......... B60R 16/0238 |
| EP | 1245455 A2 * | 10/2002 | ......... B60R 16/0238 |
| EP | 1448037 A2 * | 8/2004 | ......... B60R 16/0238 |
| EP | 0125043 A1 * | 9/2008 | |
| EP | 3038222 A1 * | 6/2016 | |
| EP | 3181407 A1 * | 6/2017 | ......... B60R 16/0238 |
| JP | H10126963 A | 5/1998 | |
| KR | 0137909 Y1 * | 4/1999 | |
| KR | 100936253 B1 * | 1/2010 | |
| KR | 20100046682 A * | 5/2010 | |
| KR | 20110077676 A * | 7/2011 | |
| KR | 20170082853 A * | 7/2017 | |
| WO | WO-2013019008 A2 * | 2/2013 | ......... B60L 11/1861 |
| WO | WO2014007007 A1 | 1/2014 | |
| WO | WO-2015139809 A1 * | 9/2015 | ............. B60R 16/03 |
| WO | WO-2015165932 A1 * | 11/2015 | ............... H01B 5/02 |
| WO | WO-2018215547 A1 * | 11/2018 | ............. H01R 9/2691 |

* cited by examiner

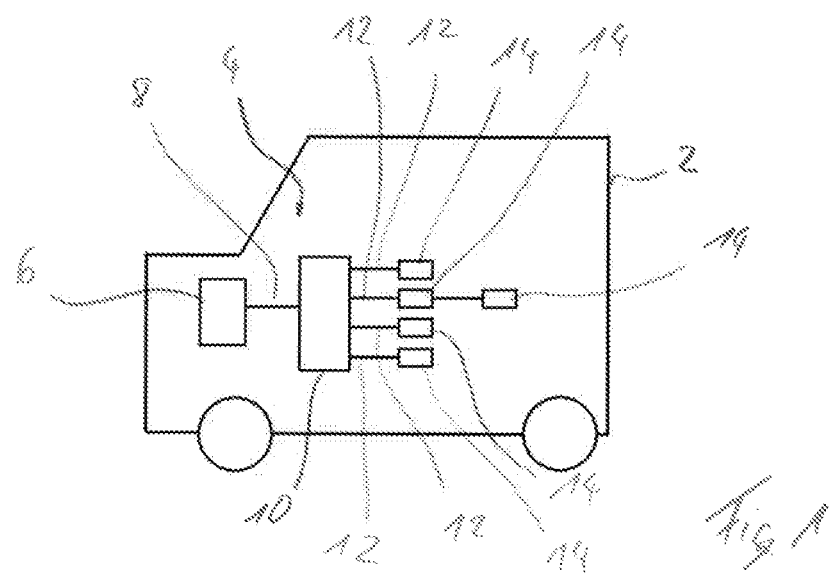
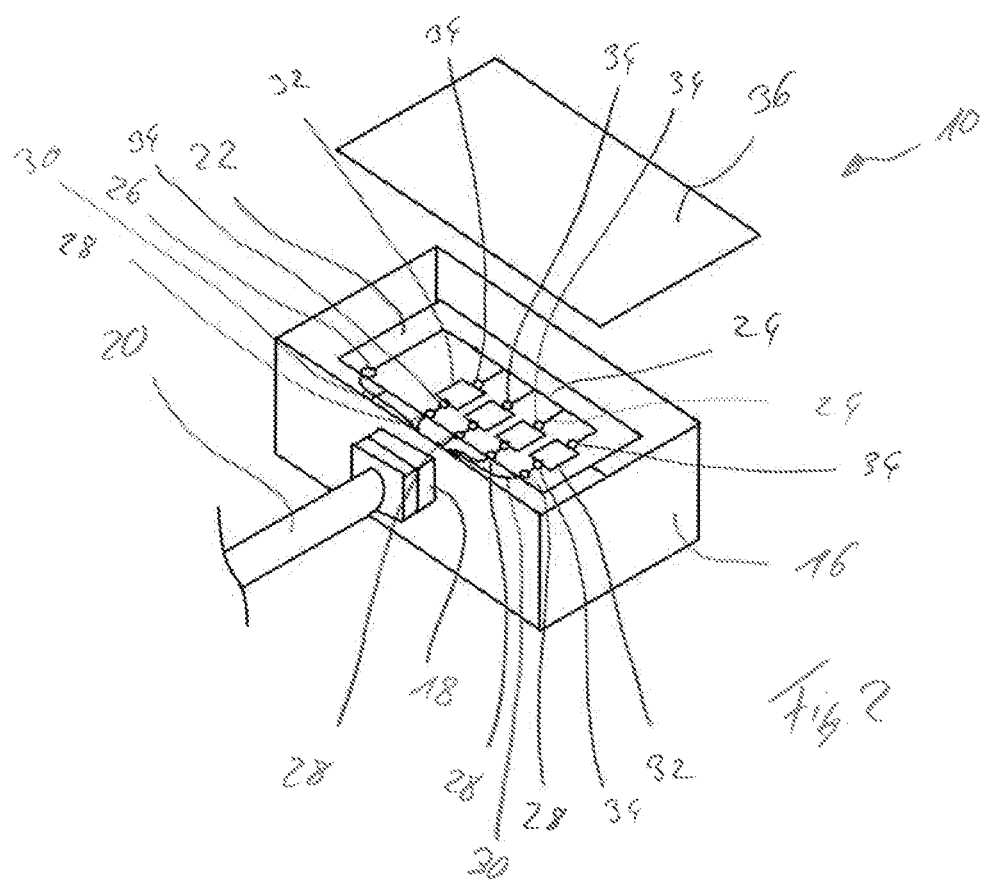

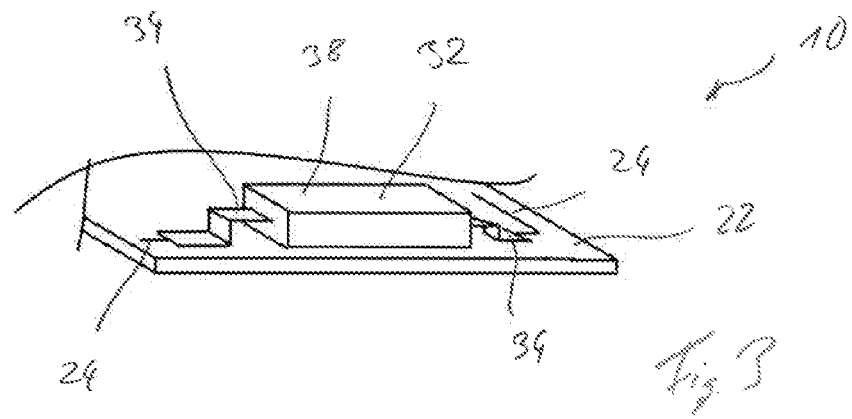
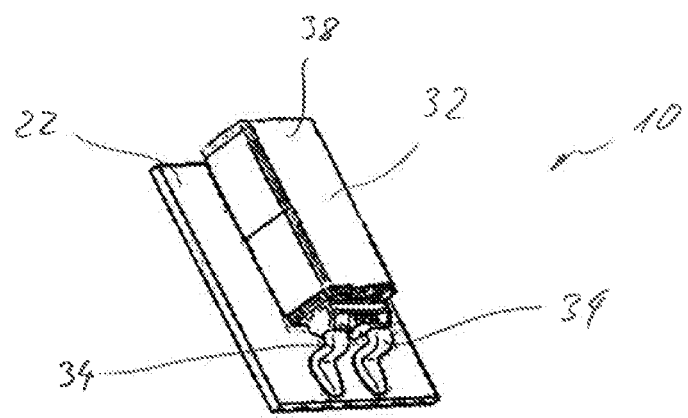
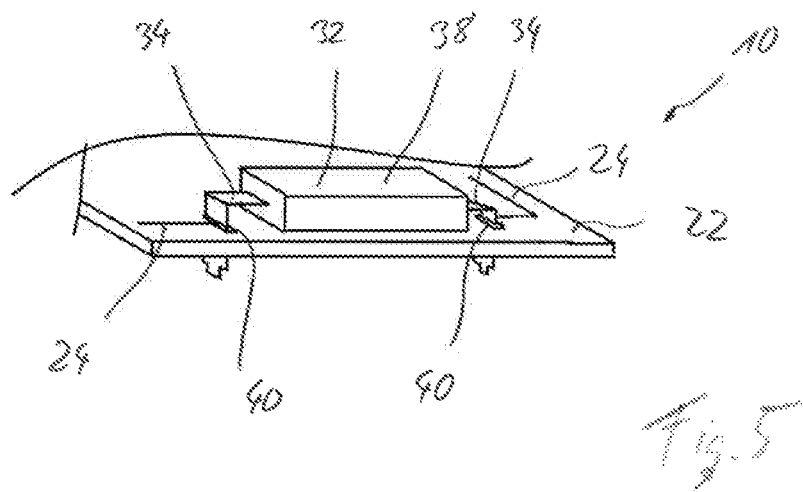

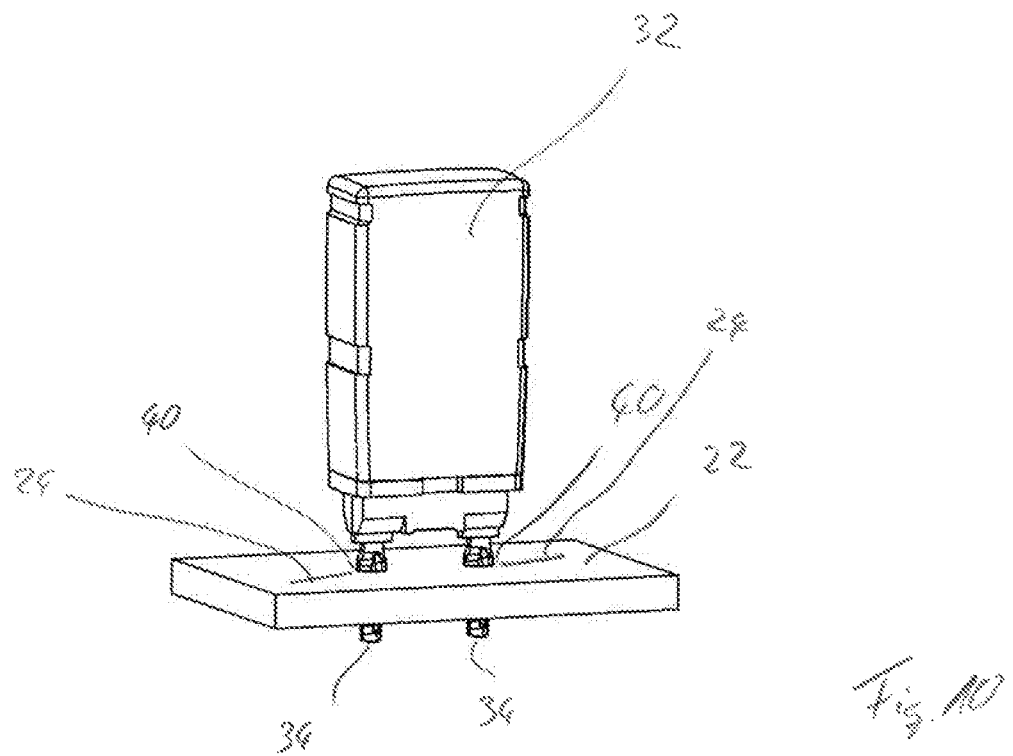
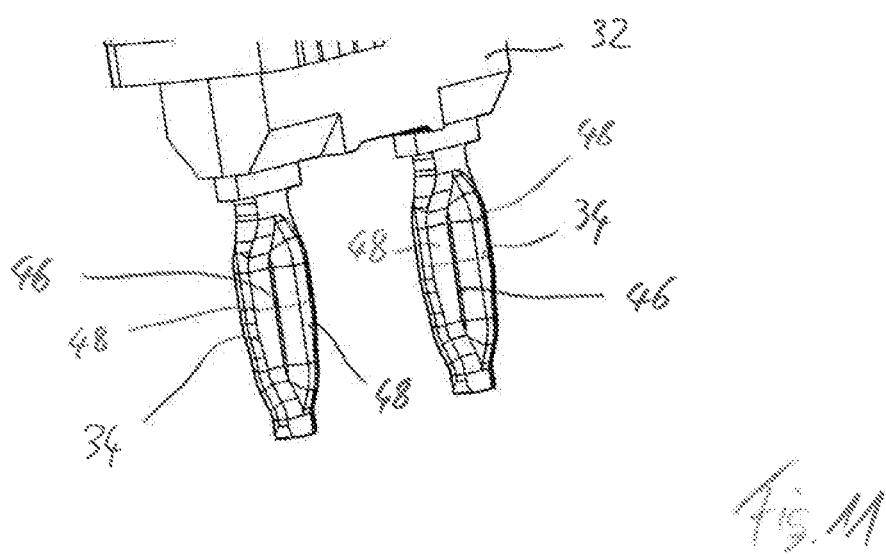

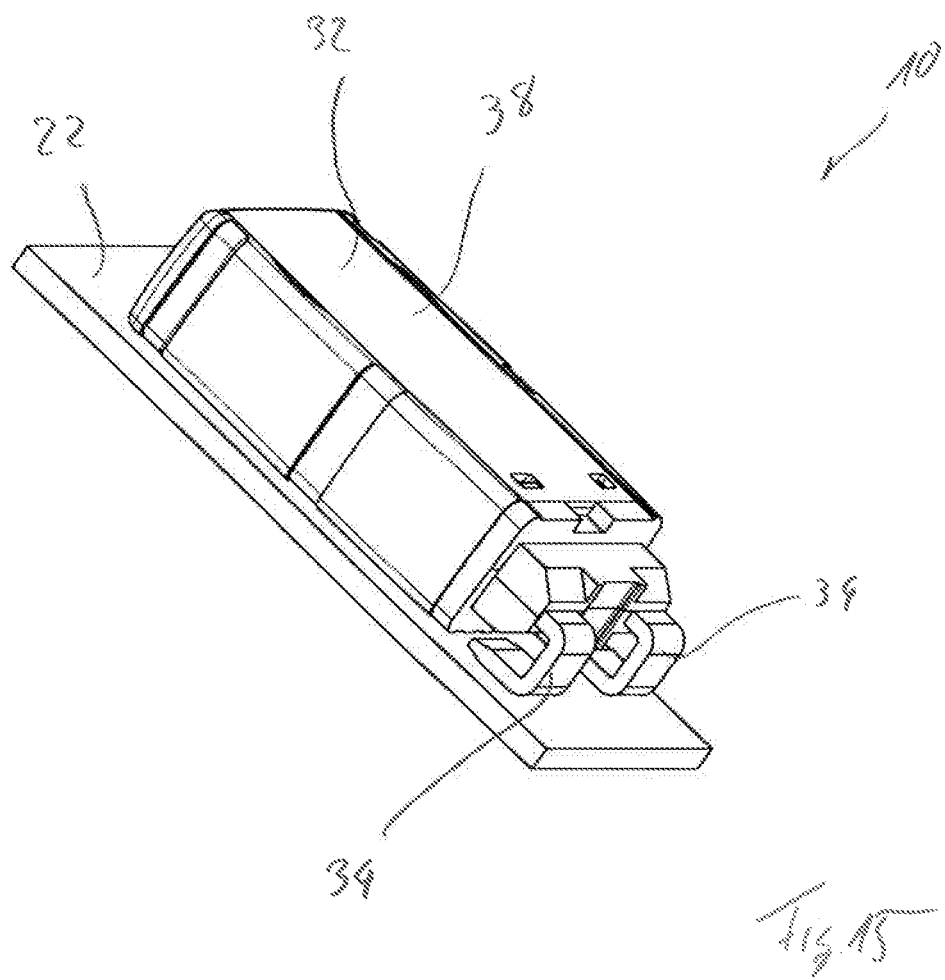

POWER DISTRIBUTOR OF AN ELECTRICAL SYSTEM OF A MOTOR VEHICLE

This nonprovisional application claims priority under 35 U.S.C. § 119(a) to German Patent Application No. 10 2020 203 560.1, which was filed in Germany on Mar. 19, 2020 and which is herein incorporated by reference.

BACKGROUND OF THE INVENTION

Field of the Invention

The present invention relates to a power distributor of an electrical system of a motor vehicle. The power distributor has a main connection for connection to a main circuit and multiple secondary connections. The invention also comprises a circuit breaker.

Description of the Background Art

Motor vehicles typically have a large number of electrical components, with the aid of which different functions are performed. An electrical component of this type is, for example, a starter, which is assigned to an internal combustion engine. A component of this type is also a lighting device, a fuel pump, an audio system or an electromotive seat adjuster. It is always necessary to provide an electrical energy and thereby to power these components for their operation. A vehicle electrical system is used for this purpose, which is supplied with the aid of an energy store, typically a battery. An electrical DC voltage is provided with the aid thereof.

To simplify mounting, a power distributor is usually provided, which has a main connection, which is electrically contacted with the battery. The power distributor furthermore has multiple secondary connections, each of these secondary connections being electrically contacted with the main connection. A connection of the electrical components takes place via the secondary connections, one secondary connection of this type being assigned to each of the components. In the case of a malfunction of one of the components, the power distributor usually has multiple fuses so that the remaining components or the battery are not damaged, one of the fuses being assigned to each of the secondary connections. The tripping value of the particular fuse is adapted to the component operated with the aid of the particular secondary connection. If the component thus has a malfunction which results in an overcurrent, the fuse is tripped, so that a reaction in the vehicle electrical system is prevented. An overload also results in a tripping of the fuse. A further damage to the component is thus prevented. When the overload is over, an operation of the component is possible only after the fuse has been replaced. It is therefore necessary to keep on hand a large number of fuses or at least one corresponding fuse for each of the secondary connections. The power distributor usually has multiple plug-in locations, a fuse of this type being assigned to each of the plug-in locations. This makes it easier to replace the fuses. The connectors are typically stabilized with respect to each other and fastened, for example, to a circuit board, with the aid of which the main connection as well as the secondary connections are provided.

For the purpose of simplification, it is known to use circuit breakers instead of fuses. The circuit breakers are typically inserted into corresponding connectors of the power distributor. Each circuit breaker includes a switching element, which is actuated when the electrical current exceeds a limit value, so that an electrical current flow is prevented. It is possible, for example, to reset the circuit breaker manually, so that, once the overload situation is over, the corresponding component may continue to operate undisturbed. Circuit breakers are also known, which are automatically reset, for example after a certain period of time has passed, making it possible to continue operating the component without manual intervention.

SUMMARY OF THE INVENTION

It is therefore an object of the present invention to provide a power distributor of an electrical system of a motor vehicle as well as a circuit breaker, a manufacturing being advantageously simplified and a mounting time and/or manufacturing costs being expediently reduced.

The power distributor is part of an electrical system of a motor vehicle. The power distributor is suitable, preferably provided and configured, for this purpose. The motor vehicle is, for example, land-based, and is, for example, a commercial vehicle, such as a truck or a bus. Alternatively, the motor vehicle is a passenger car. In one alternative, the motor vehicle is an agricultural vehicle or a construction machine, such as a tractor, excavator, front loader or dump truck. In a further alternative, the motor vehicle is, for example, not land-based and is, in particular, an aircraft, a ship or a boat.

A DC voltage is expediently conducted during operation with the aid of the vehicle electrical system, the DC voltage being suitably less than 100 V. It is therefore a so-called low-voltage vehicle electrical system. The electrical DC voltage is preferably equal to 12 V, 24 V or 48 V. The vehicle electrical system is suitably supplied with the aid of an energy store, preferably a battery, and the power distributor is, in particular, connected to the energy store. The power distributor is preferably used to power individual components of the motor vehicle. A corresponding component is, or at least comprises, for example, a lighting system, an electric motor or a heating element. The individual components are, in particular, connected to the power distributor for this purpose. For example, the connection to the components as well as to the battery is formed with the aid of a single shared connector of the power distributor.

The power distributor includes a circuit board, which comprises a main connection. The circuit board is manufactured, for example, from a fiberglass-reinforced epoxy resin, to which, for example, a number of printed conductors are connected and/or into which a number of printed conductors are embedded. The printed conductors are preferably made from copper. The circuit board is a circuit carrier.

The main connection is used for connection to a main circuit of the vehicle electrical system, the main circuit being expediently formed with the aid of a line between the power distributor and the possible energy store. In other words, the main circuit designates the electrical connection of the power distributor to the energy store. The power distributor is preferably contacted directly with the energy store, so that essentially no further structural elements are situated therebetween. For example, the main connection has two individual poles, a positive potential being applied to one of the poles and a negative potential to the remaining one. In one alternative, the main connection has only one single pole, for example a positive potential being present at this pole during operation. The remaining electrical potential provided with the aid of the energy store is preferably electrically conducted to ground. A supporting element of the motor vehicle, for example its body, is preferably electrically contacted with ground, so that this element has ground as the electrical potential. A current thus flows from the battery to the individual components via the supporting element as well as the power distributor.

The circuit board furthermore includes multiple secondary connections, each of the secondary connections preferably having the same number of poles, which is, in particular, equal to the number of the poles of the main connection. A secondary circuit is assigned to each secondary connection, each secondary circuit including, in particular, one of the components. For example, the exact same number of components as secondary circuits is thus present. Alternatively, for example, multiple components are assigned to at least one of the secondary circuits. The main connection as well as the secondary connections are provided, for example, with the aid of terminals or connectors, so that a corresponding electrical contacting may take place.

Each of the secondary connections is electrically contacted with the main connection via a circuit breaker. Corresponding printed conductors of the circuit board, in particular, are used for this purpose. Consequently, the individual secondary circuits and therefore also the circuit breakers are electrically connected in parallel to each other, and the secondary circuits are supplied with the aid of the main circuit. A monitoring of the electrical current conducted with the aid of the particular secondary circuit takes place with the aid of the circuit breaker. If the electrical current and/or a present electrical voltage exceeds a certain limit value, or if the change in the particular level exceeds a certain limit value, the electrical current flow is interrupted with the aid of the circuit breaker, so that the secondary circuit assigned to the circuit breaker is no longer powered. The remaining circuit breakers are not actuated, so that an electrical current flow to the further secondary circuits also continues to be possible. The circuit breakers are used, in particular, to protect the line, i.e. to protect the electrical connection between the power distributor and the particular component. The circuit breakers are furthermore also used to protect the components.

Each circuit breaker suitably includes a sensor unit, with the aid of which the electrical current flowing over the particular circuit breaker or the present electrical voltage is detected. For example, the sensor unit includes a coil for this purpose. The circuit breaker further includes a switching element, which is actuated as a function of a value detected with the aid of the sensor unit. For example, the switching element is a semiconductor device, i.e. in particular a semiconductor switch, such as a field effect transistor, and for example a MOSFET, an IGBT or GTO. In one alternative, the switching element is provided with a mechanical design and is, for example, bistable or only monostable. In other words, only one switching state of the switching element is stable in this case. An application of a force on a further part of the switching element is necessary to maintain the remaining switching state. The circuit breaker preferably includes a corresponding switching mechanism for this purpose.

In summary, each circuit breaker is thus used, in particular to automatically deactivate the assigned secondary circuit in the case of a fault current or if a permissible current and/or voltage value is exceeded, i.e. in the case of an overcurrent, fault current or, for example, an arc. The particular circuit breaker is preferably actuated when the electrical current conducted with the aid of the circuit breaker exceeds a certain limit value. A damage to the assigned secondary circuit as well as its components is thus avoided.

Each circuit breaker has two connections, one of the connections, in particular, being assigned to the main connection and the remaining connection to the particular secondary connection. In other words, in the case of an electrical current flow, the electrical current flow between the two connections takes place via the circuit breaker. To power the secondary circuit, a direct electrical current flow via the circuit breaker assigned in each case is thus necessary, for which reason the powering of the particular secondary circuit is ended directly when one of the circuit breakers is actuated. In summary, each circuit breaker represents the electrical connection between the particular secondary connection and the main connection or at least one part of the electrical connection. The remaining part is formed, for example, with the aid of a printed conductor of the circuit board.

The connections of each circuit breaker are electrically contacted with the circuit board, in particular no additional structural element being present between the connections and the circuit board. The connections are also connected, preferably fastened, to the circuit board. As a result, each circuit breaker is also fastened to the circuit board with the aid of its connections. A direct mechanical contact and a direct electrical contact of each circuit breaker, namely its two connections, with the circuit board thus occurs. Each of the connections is suitably connected to at least one of the printed conductors of the circuit board, one of the printed conductors assigned to the circuit breaker being routed to the particular secondary connection and the remaining one to the main connection. An electrical connection of the two printed conductors takes place only via the circuit breaker.

In summary, each circuit breaker is thus preferably non-detachably connected to the circuit board so that a detachment is prevented. A robustness is consequently increased. Since each of the circuit breakers is soldered directly to the circuit board and is thus fastened thereto, it is not necessary to provide additional receptacles, such as connectors, so that manufacturing costs are reduced. In addition, the number of necessary work steps is reduced, since an attachment of the circuit breakers in possible receptacles is not necessary, whereby the receptacles would have to also be connected to the circuit board. A mounting time is thus reduced. A comparatively awkward insertion of the circuit breaker into the possible receptacle is also not necessary, which simplifies a mounting. A faulty insertion is also prevented, which increases a safety. An incorrect fitting, even during maintenance, as well as a manipulation are thus avoided.

For example, each circuit breaker, or at least a part thereof, includes more than two connections, each of which is electrically contacted directly with the circuit board and connected thereto. It is thus possible to increase a current carrying capacity. Alternatively, all circuit breakers each comprise only exactly the two connections.

For example, the individual circuit breakers are structurally identical to each other. Alternatively, they are provided with the same design, i.e. they suitably operate according to the same principle but differ, for example, in terms of the limit value, i.e. in particular the tripping threshold. The tripping threshold is preferably adapted to the particular secondary circuit and the assigned component, so that a large number of different components may also be powered with the aid of the power distributor, a damage thereto being avoided.

Each circuit breaker is suitably a mechanical circuit breaker. The switching element is provided with a mechanical design and is, in particular, stabilized with the aid of the sensor unit. In the electrically conductive state, the switching element is preferably engaged with the sensor unit. The sensor unit is, for example, a bimetallic snap-action disk or another bimetallic element, such as a bimetallic strip. The switching element is preferably mechanically loaded, for example with the aid of a spring. The switching element is preferably held in a certain position with the aid of the engagement. If the determined value is exceeded, the engagement is released with the aid of the sensor unit, and the switching element is moved into another switching state due to the acting force. In the case of an excessive current, for example, the bimetallic snap-action disk is deformed, due to the heating, and the switching element is thus released. In another alternative, a force, which is opposed to the spring force or the like in the normal state, is applied to the switching element with the aid of the sensor unit. The force applied to the switching element with the aid of the sensor unit is not sufficient to keep the switching element in the original switching state only if the determined value is exceeded.

The power distributor preferably includes a housing, which is manufactured, for example, from a plastic. The circuit board is preferably arranged within the housing. The circuit board is thus protected against environmental influences with the aid of the housing, which increases a safety. A connector is suitable introduced into the housing, which is electrically contacted with the main connection and preferably with the secondary connections. It is thus possible to electrically contact the circuit board by connecting a corresponding cable to the connector. The cable preferably has multiple wires, one or two of the wires being assigned to the main circuit and the remaining wires to the secondary circuits. Only one opening is thus present in the housing, which is closed with the aid of the connector. As a result, a penetration of foreign particles into the housing is prevented or at least reduced.

For example, the housing is essentially completely closed, in particular with the exception of the possible connector. The circuit board is thus comparatively reliably protected. However, the housing particularly preferably has an opening, which is closed with the aid of a cover. In particular, an insertion of the circuit board into the housing takes place via the opening, for which reason a mounting is simplified. After the circuit board is mounted, for example, the cover is non-detachably fastened to the housing, for example by means of gluing or welding.

However, the cover is particularly preferably removable from the housing. For example, it is possible to completely remove the cover from the housing or to swivel it in relation to the housing. The cover is suitable connected to the housing with the aid of a hinge, such as a film hinge, and preferably forms a single piece therewith. To close the housing, the cover is preferably brought into engagement with further components of the housing and preferable latched thereto. The housing is this comparatively securely closed, which prevents a penetration of foreign particles. An additional seal is preferably arranged between the cover and the housing.

An inspection of the circuit board is possible, due to the removable cover. Moreover, it is possible, in particular, to check a switching state of the circuit breakers by means of visual inspection. The circuit breakers expediently include a corresponding signaling device for this purpose. A manual actuation of the circuit breakers is also possible, for example if the latter are tripped, i.e. if their switching state has changed. A comfort is consequently increased. In addition, it is not necessary to provide the circuit breaker for remote access, so that it may be reset with the aid of electrical signals. Comparatively cost-effective circuit breakers may therefore be used.

For example, each connection is created with the aid of a stamped bent part. In one refinement, each connection or at least one of the connections is slit on the free end side, i.e. on the end opposite the further constituents of the circuit breaker. The slit preferably runs essentially along the extension of the particular connection. Two tongues are thus formed, and each connection includes the two tongues. In particular, the width of the two tongues is essentially the same, so that the slit is essentially arranged in the center along the course of the connection. For example, the particular connection is completely slit, or particularly preferably only one part thereof, for example one quarter or half thereof is slit.

The two tongues of each connection are spread apart, i.e. bent with respect to each other. In particular, the two tongues are bent with respect to a further course of the connection, suitably by 90°. The tongues are preferably bent with respect to each other in different directions, so that they point in opposite directions and are in parallel to each other. The connection thus has an at least partially T-shaped cross section, due to the two tongues. For example, the tongues are bent even farther and thus have additional bends and/or kinks. Due to the two tongues, the particular connection is preferably provided with a T-shaped or Y-shaped design, so that a U shape is provided with the aid of the two tongues, each of the tongues being essentially bent into an L shape.

A contact surface of the connection on the circuit board is enlarge by spreading the two tongues apart. However, the tongues are at least arranged at a certain distance from each other on the circuit board. As a result, the circuit breaker is stabilized and consequently has a secure footing, This makes mounting easier. In addition, a detachment from the circuit board is avoided, even with a vibration of the power distributor. Both tongues are suitably joined separately to the circuit board. Even if one of the tongues becomes detached from the circuit board, an electrical contact with the circuit board is thus still present, which increases a robustness and a safety. For example, only one or multiple of the circuit breakers includes the slit connection or the slit connections. In the case of the remaining circuit breakers, the or each connection is, in particular, intact.

In one specific embodiment, the connections are joined to the circuit board with the aid of a press fit. They are inserted into a particular receptacle, for example a hole, of the circuit board and elastically and/or plastically deformed. In particular, the press fits are at least partially bent in an O shape and are part of the connections, which simplifies a manufacturing. In the mounted state, the press fits thus rest against the edges of the hole assigned in each case in a force-fitting manner, so that the circuit breakers are held securely against the circuit board. A secure electrical contact is also implemented in this manner. Each press fit is preferably implemented by introducing a slit in the longitudinal direction of the connection, the slit being closed on both sides. By bending the two legs produced in this manner against each other, the particular press fit is created, which thus forms part of the particular connection. As a result, no additional structural element is necessary and a manufacturing is simplified.

The connections of each circuit breaker can be soldered directly to the circuit board. An integral connection of the connections with the circuit board consequently takes place. A robustness is thus increased. A manufacturing is also simplified. In addition, there are no comparatively great changes to the material of the connections, for which reason the manufacturing costs are reduced.

Each circuit breaker can be made from suitable materials, which are, in particular, heat-proof, at least at a temperature used for soldering to the circuit board. No further protective measures are thus necessary during manufacturing, for which reason a manufacturing is simplified and rejects are reduced. At least one of the connections or multiple of the connections is/are preferably galvanized, so that a soldering process is simplified. For example, the soldering takes place by means of hard soldering or particularly preferably by means of soft soldering, so that a manufacturing is simplified.

For example, each connection of the circuit breakers is inserted through a corresponding hole in the circuit board and soldered there. In particular, the soldering takes place on the side of the circuit board opposite the side from which the particular connection is inserted into the corresponding hole. If each connection has two tongues, a corresponding hole is assigned, in particular, to each of the tongues. In particular, an edge of each hole is at least partially formed with one of the printed conductors of the circuit board in each case. In summary, the joining of the circuit breakers to the circuit board thus takes place by means of THT (through-hole technology) mounting. An automated manufacturing of the power distributor is thus possible. A manual removal of the circuit breaker is also possible, for example, if it has a fault. It is therefore not necessary to replace the entire circuit board if one of the circuit breakers is defective.

Each connection can rest flat against the circuit board on the free end side and is soldered there. In particular, the joining takes place by surface mounting, and the circuit breakers are thus designed as SMDs (surface-mounted devices). If the connections have tongues, the latter preferably each rest completed or at least partially flat against the circuit board. For example, each connection includes additional constituents, which are situated at a distance from the circuit board, which simplifies a positioning of the particular circuit breaker. The connections are, in particular, suitably bent so that they rest flat against the circuit board on the free end side. At least one quarter of each connection preferably rests flat against the circuit board, which increases a stability. Each connection preferably rests against/on a solder pad of the circuit board, each of which, in particular, transitions into a printed conductor.

The circuit breaker can include a circuit breaker housing, which is manufactured, for example, from a plastic. The particular circuit breaker housing is provided, for example, with a multi-part design and/or has an opening for the possible signaling device and/or an actuating apparatus, with the aid of which a reset of the particular circuit breaker and/or a change in the particular switching state is made possible. The particular switching element and/or the possible sensor unit is/are arranged within each circuit breaker housing. They are thus again protected with the aid of the particular circuit breaker housing. For example, the circuit breaker housing is essentially rectangular, which simplifies a storage.

The two connections can project out of the particular circuit breaker housing and can be thus inserted through the circuit breaker housing into the interior of the assigned circuit breaker housing. An electrical contacting of the constituents of the particular circuit breaker arranged in the particular circuit breaker housing with the aid of the particular connections is thus made possible For example, the two connections are assigned to one of the sides of the particular circuit breaker housing, so that the circuit breaker housing may be positioned on the circuit board in a comparatively space-saving manner. The contacting of the particular circuit breaker with the circuit board is also thus possible only on a single side of the circuit breaker housing. In one alternative, the connections are assigned, for example, to different sides of the particular circuit breaker housing, the sides preferably being oppositely situated. As a result, they have a comparatively great distance from each other and are separated from each other with the aid of the assigned circuit breaker housing. A short-circuit therebetween is this avoided. However, a joining of the connection to the circuit board is simplified.

For example, each circuit breaker housing can be situated at a distance from the circuit board and runs essentially perpendicularly thereto. The circuit breakers may thus be arranged comparatively close together, for which reason a space requirement on the circuit board, and thus material costs, are reduced.

The connections can be designed in such a way that the circuit breaker housings rest against the circuit board over a wide area. For example, the connections are arranged in such a way that the circuit breaker housings rest against the circuit board over a wide area. Alternatively, at least one of the connections of each circuit breaker, preferably both of them, is correspondingly bent and thus do not have a straight profile. In this way, a corresponding arrangement of the circuit breaker housings is also possible. The circuit breaker housings are thus essentially rectangular, and one of the sides expediently rests entirely against the circuit board. For example, the circuit breakers only rest loosely against the circuit board or are fastened thereto. Due to the contact, each circuit breaker housing is thus at least partially stabilized with the aid of the circuit board, so that a load on the assigned connections is reduced upon a shaking of the power distributor. The circuit breaker housings are suitably made from a heat-proof material, so that they are not damaged during a soldering of the connections to the circuit board.

For example, the circuit breakers have an electrically controlled tripping. A flexibility is thus increased. In particular, the electrical current carried by each circuit breaker/electrical voltage present is/are detected with the aid of a particular sensor and evaluated with the aid of an electronic system. An actuation of the particular switching element takes place thereby. A large number of different applications may thus be covered with the aid of the circuit breaker. In particular, the particular electronic system is programmable, so that circuit breakers of the same design may be used, the adaptation to the particular application situation taking place by programming the electronic system. In a further alternative, each circuit breaker has a magnetic tripping. A comparatively fast tripping is thus implemented upon exceeding the limit value assigned in each case, for which reason a damage to the components powered with the aid of the particular secondary circuit is reliably avoided.

However, at least one of the circuit breakers, preferably all circuit breakers, particularly preferably is/are a thermal circuit breaker and thus has/have, in particular, a thermal tripping. This circuit breaker therefore comprises a bimetallic element, which is designed, in particular, as a bimetallic snap-action disk. During operation, the electrical current conducted with the aid of the circuit breaker is carried with the aid of the bimetallic element, so that an overheating of the bimetallic element takes place in the case of an overcurrent. As a result, a bending of the bimetallic element occurs, so that an electrical contacting with at least one of the connections is released. As a result, the electrical current flow is interrupted. The bimetallic element thus performs, in particular, the functions of the switching element as well as the sensor unit. A circuit breaker of this type may be manufactured comparatively cost-effectively, for which reason manufacturing costs of the power distributor are reduced.

The circuit breaker is suitable, in particular provided and configured, to be electrically contacted with and connected to a circuit board of a power distributor of an electrical system of a motor vehicle. The circuit board has a main connection for connection to a main circuit as well as multiple secondary connections for connection to a particular secondary circuit. One of the secondary connections is electrically connected to the main connection via the circuit breaker. For this purpose, the circuit breaker includes two connections, which are electrically contacted with the circuit board. The connections are designed, for example, for surface mounting (SMD technology) of for through-hole mounting (THT).

The refinements and advantages explained in connection with the power distributor are to be similarly transferred to the circuit breaker and vice versa.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein:

FIG. 1 shows a schematically simplified view of a motor vehicle, including a power distributor;

FIG. 2 shows a perspective view of the power distributor, which includes a circuit board as well as multiple circuit breakers; and FIGS. 3 through 10 each show a perspective view of different specific embodiments of the circuit breaker;

FIG. 11 shows an enlarged detail of the circuit breaker according to FIG. 10; and FIGS. 12 through 15 each show a perspective view of further specific embodiments of the circuit breaker.

DETAILED DESCRIPTION

Figure 6:
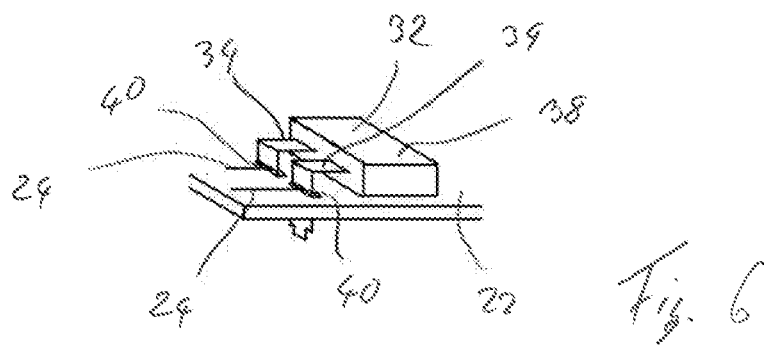

FIG. 1 shows a schematically simplified view of a motor vehicle 2 in the form of a passenger car. Motor vehicle 2 includes a vehicle electrical system 4, which is supplied with the aid of an energy store 6, namely a battery. An electrical DC voltage of 12 V, 24 V or 48 V is provided with the aid of energy store 6. Vehicle electrical system 4 is thus a low-voltage vehicle electrical system. Energy store 6 has two poles, one of the poles, namely the electrical negative pole, is electrically contacted with a supporting element of motor vehicle 2 and is thus electrically routed to ground. The remaining electrical pole is routed to a power distributor 10 with the aid of a cable, which partially forms a main circuit 8.

Multiple secondary circuits 12 are electrically contacted with power distributor 10, four secondary circuits 12 of this type being present in this example. Each of secondary circuits 12 includes at least one component 14, each of which requires electrical energy for operation. One of components 14 is thus an electromotive fuel pump, one of components 14 is an electromotive seat adjuster and a further of components 14 is a lighting apparatus. In the illustrated variant, one of secondary circuits 12 includes two components 14 of this type, which are electrically connected in series or electrically connected in parallel to each other. The provision of the electrical energy taken from energy store 6 takes place with the aid of power distributor 10. During the operation of motor vehicle 2, energy store 6 is supplied with the aid of a generator, which, in turn, is operated with the aid of an internal combustion engine, which is not illustrated in greater detail. In summary, individual components 14 are powered with the aid of power distributor 10.

FIG. 2 shows a perspective view of power distributor 10, which in the mounted state is arranged in an engine compartment of motor vehicle 2. Power distributor 10 includes a cup-shaped, cuboid housing 16, which is manufactured from a plastic. A connector 18 is introduced into a side wall of housing 16, into which a cable 20 is inserted in the mounted state, which has a number of wires, which are not illustrated in greater detail. The number of wires is equal to the number of secondary circuits 12 plus one. Cable 20 consequently has five wires of this type.

A circuit board 22 is arranged within housing 16, which is manufactured from a fiberglass-reinforced epoxy resin, to which a number of printed conductors 24 manufactured from copper are connected. Circuit board 22 includes a main connection 26 as well as multiple secondary connections 28, the number of secondary connections 28 being equal to the number of secondary circuits 12. An electrical connecting part 30, for example a cable, is electrically connected to main connection 26 as well as to each of secondary connections 28. Main connection 26 and secondary connections 28 are designed as solder pads in one variant, and electrical connecting parts 30 are soldered thereto. In one alternative, main connection 26 and secondary connections 28 are designed as terminals or connectors, and electrical connecting parts 30 are clamped or inserted therein.

Electrical connecting parts 30 are connected to connector 18, each of electrical connecting parts 30 being assigned to one of the wires of cable 20 and electrically contacted therewith. Electrical connecting part 30, which is electrically connected to main connection 28, is contacted with the wire of cable 20 assigned to main circuit 8, while secondary connections 28 are contacted with the wires of cable 20 assigned to secondary circuits 12 with the aid of particular electrical connecting part 30. One of secondary circuits 12 is thus assigned to each secondary connection 28, and main connection 26 is used for connection to main circuit 8.

Power distributor 10 further has a number of circuit breakers 32, the number of circuit breakers 32 being equal to the number of secondary circuits 12. Each circuit breaker 32 includes two connections 34, one of connections 34 being electrically contacted with one of secondary connections 28 via one of printed conductors 24 in each case. Remaining connections 34 of circuit breakers 32 are routed together to main connection 26. As a result, circuit breakers 32 are electrically connected in parallel to each other, and each secondary connection 28 is assigned to one secondary circuit 12 in each case, which are each electrically connected to main connection 26 via one of circuit breakers 32, each of circuit breakers 32 including both connections 34.

Each of connections 34 of each circuit breaker 32 is electrically contacted with particular printed conductor 24 and soldered thereto. Connections 34 of each circuit breaker 32 are therefore soldered directly to circuit board 22. Circuit breakers 32 are thus held on circuit board 22 by means of the solder. In addition, a direct electrical contacting with circuit board 22 takes place, namely to assigned printed conductors 24 in each case. In summary, connections 34 of each circuit breaker 32 are electrically contacted directly with circuit board 22 and joined thereto.

Circuit breakers 32 are designed as thermal circuit breakers and thus each have a current path formed between particular connections 34, which comprises a bimetallic element, which is not illustrated in greater detail, in the form of a bimetallic snap-action disk. In other words, circuit breakers 32 are mechanical circuit breakers. If an overcurrent is conducted with the aid of one of circuit breakers 32, a heating of the bimetallic snap-action disk takes place, so that it bends. As a result, an electrical contacting with further constituents of the current pat of particular circuit breaker 32 is released, so that the current path formed between connections 34 is interrupted. Circuit breakers 32 differ from each other only in the selection of the bimetallic snap-action disk or the fastening thereof and are otherwise of the same design. The bimetallic snap-action disks or the fastenings are selected in such a way that the overcurrent at which a bending of the bimetallic snap-action disk takes place is set to particular components 14.

Each of circuit breakers 32 includes a signaling device, which is not illustrated in greater detail, and/or an actuating apparatus. A present switching state of each of circuit breakers 32 is represented with the aid of the signaling device. The present position of the bimetallic snap-action disk is thus symbolized with the aid of the signaling device. The actuating apparatus makes it possible to change the switching state of each of circuit breakers 32 and to therefore trip it manually or to reset it to the electrically conductive state. In one alternative, either the signaling device, the actuating apparatus or both are not present.

Power distributor 10 includes a cover 36, which is made from the same material as housing 16. Cover 36 is removable from housing 16 and may be engaged there with the aid of elements, which are not illustrated in greater detail, so that cover 36 is held on housing 16 in a stable manner. A penetration of foreign particles is thus avoided. It is possible to release the engagement, so that cover 36 continues to be removable from housing 16. Due to removable cover 36, it is possible to control the signaling device of individual circuit breakers 32 and/or to actuate the actuating apparatus. If this has been done, housing 16 is again closed with the aid of cover 36. so that circuit breakers 32 are protected.

FIG. 3 shows a perspective view of one of circuit breakers 32 of the same design. Circuit-breaker 32 includes an essentially rectangular circuit breaker housing 38, which is manufactured from plastic. A side of circuit breaker housing 38 arranged in parallel to circuit board 22 rests against circuit board 22 over a wide area and is thus stabilized. The bimetallic snap-action disk as well as further components of circuit breaker 32 are each arranged within circuit breaker housing 38. The two connections 34, which project out of circuit-breaker housing 38 on opposite sides thereof, are situated outside circuit breaker housing 38 as sole constituents of circuit breaker 32, the sides being arranged essentially perpendicularly to circuit board 22. Connections 34 project essentially out of the center of each assigned side and are bent in the shape of a Z. Each of connections 34 rests flat against circuit board 22 on the free end side, circuit breaker housing 38 also resting against the circuit board over a wide area. Connections 34 are thus designed in such a way that circuit breaker housing 38 rests against circuit board 22 over a wide area. The free ends of each connection 34, which rest against circuit board 22 are soldered with particular printed conductor 24 in this location. Circuit breaker 32 is therefore a surface-mounted device (SMD). Connections 34 are designed as sheet metal parts and galvanized, so that a soldering to printed conductors 24 is possible.

FIG. 4 shows a perspective view of a further specific embodiment of circuit breakers 32. Once again, cuboid circuit breaker housing 38 is present, whose one side rests against circuit board 22 over a wide area. The two connections 34 are assigned to a shared side of circuit breaker housing 38. Once again, the side of circuit breaker housing 38 from which connections 34 project is arranged perpendicularly to circuit board 22, and the entry point of connections 34 into circuit breaker housing 38 is situated at a distance from circuit board 22. Connections 34 are again bent in the shape of a Z, so that they rest flat against circuit board 22 on the free end side. Once again, it is possible to fasten circuit breaker 32 to circuit board 22 by means of surface mounting.

FIG. 5 shows a modification of circuit breaker 32 illustrated in FIG. 3, essentially only the free ends of connections 34 being changed. They now no longer rest flat on circuit board 22, but are each inserted through a corresponding hole 40 in circuit board 22. Each of holes 40 is lined with an electrically conductive material, which is electrically contacted with each assigned printed conductor 24. Connections 34, which are each provided with an essentially L-shaped design, are soldered to circuit board 22 in the area of hole 40 and preferably on the side of circuit board 22 situated opposite circuit breaker housing 38. In other words, circuit breaker 32 is mounted by means of through-hole mounting (THT), Connections 34 are provided with a stepped design on the free end side for easier insertion into particular holes 40.

FIG. 6 shows a refinement of circuit breaker 32 illustrated in FIG. 5.

Here circuit breaker 32 is again fastened by means of through-hole mounting to circuit board 22, which has the two holes 40 for this purpose. Connections 34 of circuit breaker 32 are also correspondingly shaped and provided with an L-shaped design. However, in contrast to the variant illustrated in FIG. 5, connections 34 project out of a shared side of circuit breaker housing 38, according to the variant shown in FIG. 4.

Figure 7:
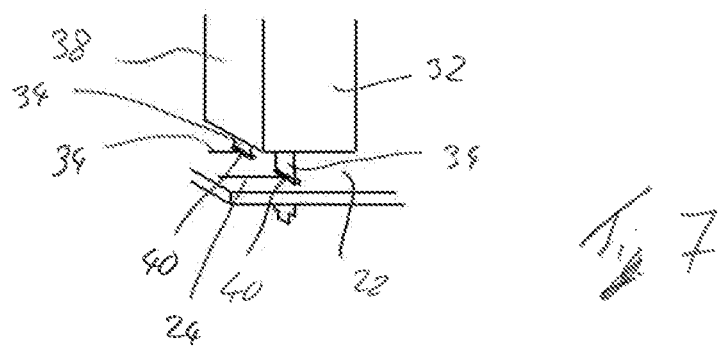

FIG. 7 shows a modification of circuit breaker 32 illustrated in FIG. 6.

Here connections 34 are also inserted through corresponding holes 40 in circuit board 22, and connections 34 project out of a shared side of circuit breaker housing 38. The profile of connections 34 is, however, straight, and circuit breaker housing 38 is situated at a distance from circuit board 22. A space requirement on circuit board 22 is therefore reduced.

Figure 8:
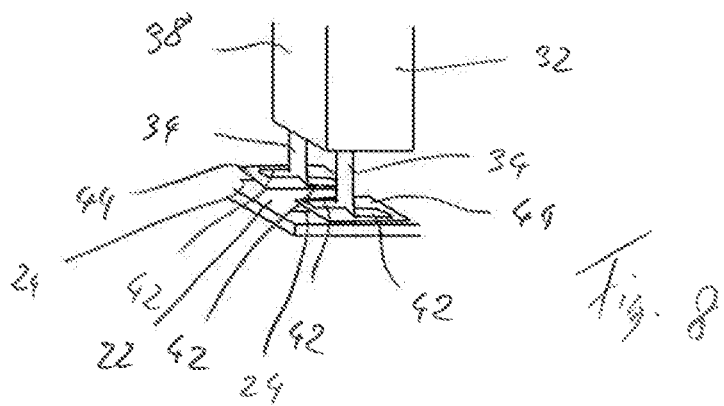

FIG. 8 shows a modification of circuit breaker 32 illustrated in FIG. 7. Here circuit breaker housing 38 is also spaced a distance apart from circuit board 22. The free end of each connection 34 is slit along half its length outside circuit breaker housing 38, so that two tongues 42 are formed. The two tongues 42 are bent by 90° with respect to the further profile of connection 34, but in different directions. Tongues 42 of each connection 34 are thus spread apart, and each connection 34 is essentially T-shaped. Tongues 42 each rest over the entire area of a solder pad 44 of circuit board 22, each solder pad 44 transitioning into one of printed conductors 24 and being produced from a copper. Tongues 42 are soldered to solder pad 44 assigned in each case by means of surface mounting. Due to the two tongues 42, a footing of circuit breaker 32 on circuit board 22 is improved before, after and during mounting, so that a robustness is increased.

Figure 9:
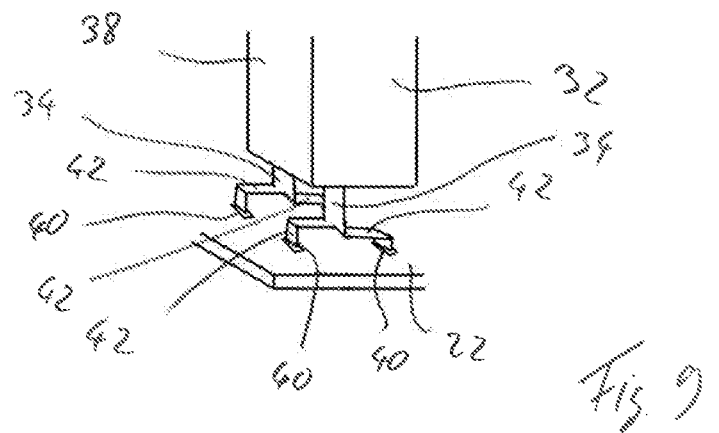

FIG. 9 shows a further modification of circuit breaker 32, which is based on the variant shown in FIG. 8. Tongues 42 are again bent by 90° on the free end side, so that they face away from circuit breaker housing 38 on the end side. This part of tongues 42 is inserted through one of holes 40 in circuit board 22 in each case and soldered there. Holes 40 are again lined with an electrically conductive material, namely the same material from which printed conductors 24 are made, and are each electrically contacted with one of printed conductors 24. The two holes 40, which are assigned to same connection 34, are electrically contacted with same printed conductor 24. This circuit breaker 32 is thus also suitable for through-hole mounting, and a stability is increased compared to the variant illustrated in FIG. 7, due to the two tongues 42.

FIG. 10 shows a further modification of circuit breaker 32, which is also connected to circuit board 22 and electrically contacted therewith. Circuit breaker 32 again includes the two connections 34, which are each inserted through one of corresponding holes 40 in circuit board 22. Holes 40 are again lined with an electrically conductive material, which transitions into an assigned printed conductor 24 in each case. However, connections 34 are not soldered to circuit board 22 but are designed as a so-called press fit. Connections 34 are thus situated in a force-fitting manner within hole 40 assigned in each case, so that a detachment of circuit breaker 32 from circuit board 22 is prevented. A comparatively low electrical contact resistance between connections 34 and holes 40, and therefore also assigned printed conductors 24, is thus implemented. The joining and electrical contacting thus takes place, namely by inserting connections 34 into hole 40 assigned in each case. Since no additional material, such as solder, and no additional process step, such a soldering, is needed, a manufacturing time is further shortened.

FIG. 11 shows an enlarged detail of circuit breaker 32 illustrated in FIG. 10. Each of connections 34 is designed as a stamped bent part. Connections 34 are essentially strip-shaped and have a slit 46 along their extension, each of which is closed on the end side. Each of slits 46 are thus limited by the material of connection 34 assigned in each case. As a result, two legs 48 in parallel to each other are formed. They are bent away from each other, so that the extension of each connection 34 is enlarged transversely to its profile. The two legs 48 are bent in the middle in opposite directions with respect to each other, the bending direction being in parallel to the depth of slit 46. Legs 48 thus rest at least partially against each other, for which reason they stabilize each other, which increases a robustness. It is nevertheless possible to elastically move the two legs 48 toward each other during insertion into each assigned hole 40, so that a force-fitting connection to circuit board 22 takes place.

Figure 12:
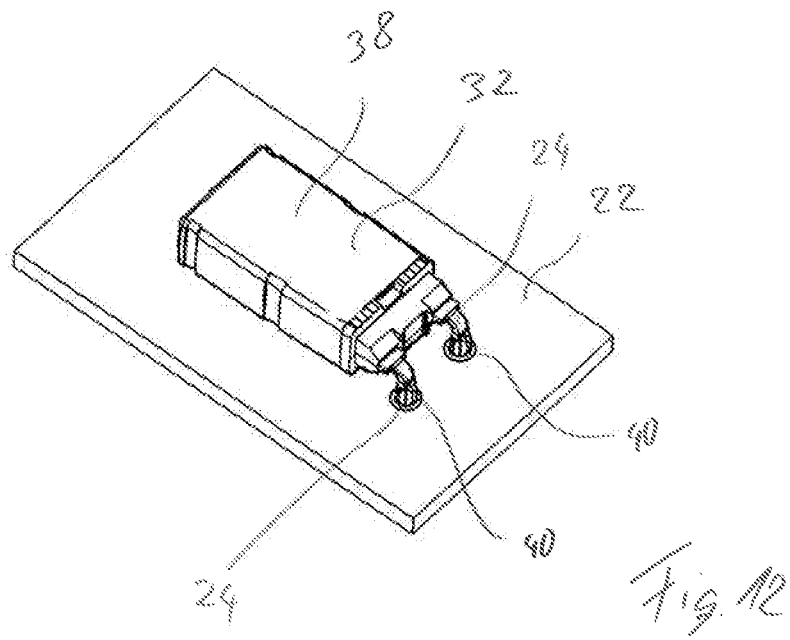

FIG. 12 shows a further modification of circuit breaker 32. Circuit breaker housing 38 abuts circuit board 22 therein according to the specific embodiments illustrated in FIG. 4 or 6. Connections 24 are L-shaped according to the specific embodiment shown there in each case, but are not soldered to circuit board 22 in a deviation therefrom. Instead, they are designed as a press fit according to the variant illustrated in FIG. 10 and inserted through a hole 40 assigned in each case, so that the electrical contacting and joining to circuit board 22 takes place with the aid of the press fit.

Figure 13:
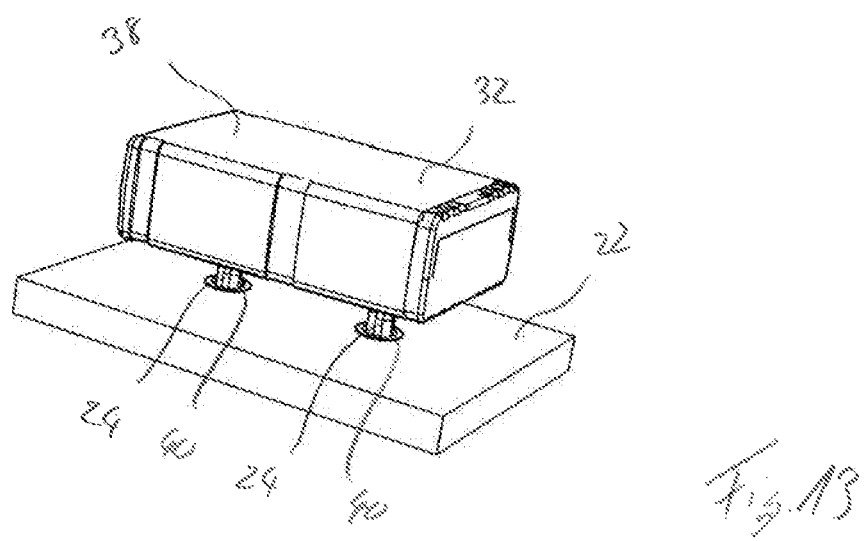

FIG. 13 shows a further modification of circuit breaker 32. In this case, circuit breaker housing 38 is situated at a distance from circuit board 22 according to FIG. 10, which, however, is deviatingly not arranged perpendicularly to circuit board 22 but in parallel thereto. Connections 24 here are also designed here as a press fit and project out of circuit breaker housing 38 on the side assigned to circuit board 22 and are also again inserted through a corresponding hole 40 in each case. In this manner, a stability is increased compared to the variant illustrated in FIG. 10.

Figure 14:
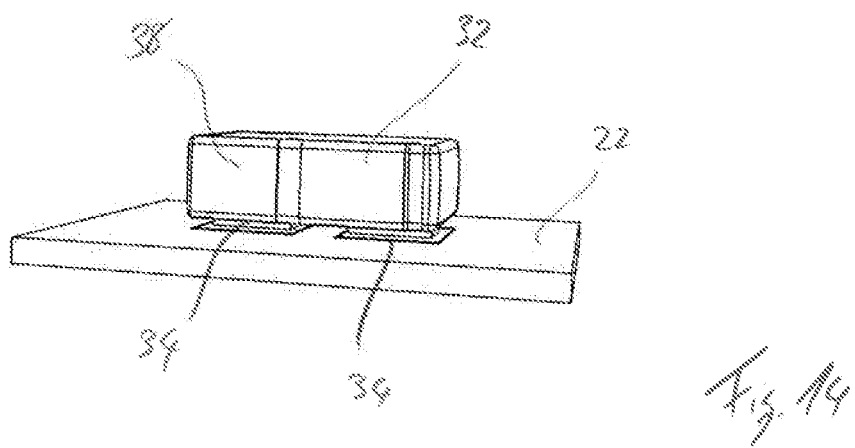

FIG. 14 shows a further specific embodiment of circuit breaker 32. Circuit breaker housing 38 is oriented with respect to circuit board 22 according to the variant illustrated in FIG. 13 and is situated at a distance therefrom. Connections 34 are each designed as flat metal plates or wafers. Connections 34 rest on solder pads of circuit board 22 and are soldered thereto. A stability of circuit breaker 32 is thus relatively high, and a space requirement is relatively low. An SMD method is used for mounting.

FIG. 15 shows a further specific embodiment of circuit breaker 32, which is based on the variant shown in FIG. 4. Connections 34 of the circuit breaker are deviatingly not bent in the shape of a Z but are provided with a U-shaped design. As a result, the free ends of connections 34 also lie flat against circuit board 22, but point in the direction of circuit breaker housing 38, which again rests on circuit board 22. A space requirement is thus reduced, The invention is not limited to the exemplary embodiments described above. Instead, other variants of the invention may be derived herefrom by those skilled in the art without going beyond the subject matter of the invention. Moreover, in particular, all individual features described in connection with the individual exemplary embodiments may also be otherwise combined with each other without going beyond the subject matter of the invention.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A power distributor of an electrical system of a motor vehicle, the power distributor comprising:
    circuit breakers; and
    a circuit board that has a main connection to a main circuit and at least two secondary connections, each of the at least two secondary connections being assigned to one secondary circuit and electrically contacted with the main connection via a respective one of the circuit breakers,
    wherein each of the circuit breakers include two connections extending therefrom that are electrically contacted directly with the circuit board and joined thereto, and
    wherein each of the two connections of each of the circuit breakers is slit on a free end side to form two tongues, the two tongues of each of the two connections being spread apart.

2. The power distributor according to claim 1, wherein at least one of the circuit breakers is a mechanical circuit breaker.

3. The power distributor according to claim 1, wherein the circuit board is arranged in a housing closed via a removable cover.

4. The power distributor according to claim 1, wherein each of the two connections of each of the circuit breakers is inserted through a corresponding hole in the circuit board and soldered there.

5. The power distributor according to claim 1, wherein the two connections of each of the circuit breakers are soldered directly to the circuit board.

6. The power distributor according to claim 5, wherein each of the two connections of each of the circuit breakers rests flat against the circuit board on a free end side and is soldered there.

7. The power distributor according to claim 1, wherein each of the circuit breakers includes a circuit breaker housing, out of which the two connections project, the two connections being designed such that the circuit breaker housing rests against the circuit board over a wide area.

8. The power distributor according to claim 1, wherein at least one of the circuit breakers is a thermal circuit breaker.

9. The power distributor according to claim 1, wherein the main connection and the at least two secondary connections are each formed as solder pads or terminals or connectors.

10. The power distributor according to claim 1, wherein a first one of the two connections of each of the circuit breakers is connected to the main connection and a second one of the two connections of each of the circuit breakers is connected to a respective one of the at least two secondary connections.

11. A circuit breaker of a power distributor, the circuit breaker comprising:
two connections extending therefrom that are electrically contacted directly with a circuit board and joined thereto,
wherein each of the two connections of the circuit breaker is slit on a free end side to form two tongues, the two tongues of each of the two connections being spread apart.

12. The circuit breaker according to claim 11, wherein a first one of the two connections is connected to a main connection provided on the circuit board and a second one of the two connections is connected to a secondary connection provided on the circuit board.

* * * * *